(12) United States Patent
Goto et al.

(10) Patent No.: US 11,983,586 B2
(45) Date of Patent: May 14, 2024

(54) CERAMIC CIRCUIT BOARD, HEAT-DISSIPATING MEMBER, AND ALUMINUM-DIAMOND COMPOSITE

(71) Applicant: DENKA COMPANY LIMITED, Tokyo (JP)

(72) Inventors: Daisuke Goto, Tokyo (JP); Hiroaki Ota, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/791,971

(22) PCT Filed: Mar. 25, 2021

(86) PCT No.: PCT/JP2021/012500
§ 371 (c)(1),
(2) Date: Jul. 11, 2022

(87) PCT Pub. No.: WO2021/193810
PCT Pub. Date: Sep. 30, 2021

(65) Prior Publication Data
US 2023/0042932 A1    Feb. 9, 2023

(30) Foreign Application Priority Data
Mar. 26, 2020   (JP) ................. 2020-055457

(51) Int. Cl.
*G06K 19/02*   (2006.01)
*B32B 3/30*    (2006.01)
(Continued)

(52) U.S. Cl.
CPC ............. *G06K 19/02* (2013.01); *B32B 3/30* (2013.01); *B32B 15/016* (2013.01);
(Continued)

(58) Field of Classification Search
None
See application file for complete search history.

(56) References Cited

U.S. PATENT DOCUMENTS 7,728,231 B2   6/2010   Matsui et al.
7,906,731 B2   3/2011   Matsui et al.
(Continued)

FOREIGN PATENT DOCUMENTS

EP    3185655 A1 *   6/2017   ............ G09F 7/165
EP    3 361 504 A1    8/2018
(Continued)

OTHER PUBLICATIONS

Jun. 8, 2021 International Search Report issued in Patent Application No. PCT/JP2021/012500.
(Continued)

*Primary Examiner* — Kristy A Haupt
(74) *Attorney, Agent, or Firm* — Oliff PLC

(57) ABSTRACT

A ceramic circuit board includes a ceramic base material, a metal layer (first metal layer), and a marker portion. The marker portion is formed on the surface of the first metal layer. The surface of the metal layer (first metal layer) may be plated. When the surface of the metal layer (first metal layer) is plated, the marker portion may be formed on the plating.

8 Claims, 4 Drawing Sheets

(51) Int. Cl.
*B32B 7/08* (2019.01)
*B32B 7/12* (2006.01)
*B32B 15/01* (2006.01)
*B32B 15/04* (2006.01)
*B32B 18/00* (2006.01)
*G06K 19/06* (2006.01)
*H01L 23/498* (2006.01)
*H01L 23/544* (2006.01)
*H05K 1/02* (2006.01)
*H05K 7/20* (2006.01)

(52) U.S. Cl.
CPC ...... *B32B 15/043* (2013.01); *G06K 19/06037* (2013.01); *H01L 23/544* (2013.01); *H05K 1/0269* (2013.01); *H05K 7/205* (2013.01); *B32B 7/08* (2013.01); *B32B 7/12* (2013.01); *B32B 18/00* (2013.01); *B32B 2255/06* (2013.01); *B32B 2255/205* (2013.01); *B32B 2264/108* (2013.01); *B32B 2307/302* (2013.01); *B32B 2307/538* (2013.01); *B32B 2457/08* (2013.01); *H01L 23/49838* (2013.01); *H01L 2223/54406* (2013.01); *H01L 2223/54413* (2013.01); *H05K 1/0204* (2013.01)

(56) References Cited

U.S. PATENT DOCUMENTS

| | | | |
|---|---|---|---|
| 9,017,824 | B2 | 4/2015 | Hirotsuru et al. |
| 11,049,803 | B2 | 6/2021 | Matsumoto et al. |
| 2006/0022020 | A1 | 2/2006 | Schulz-Harder |
| 2006/0202324 | A1 | 9/2006 | Hashimoto et al. |
| 2008/0043473 | A1 | 2/2008 | Matsui |
| 2010/0046232 | A1 | 2/2010 | Matsui et al. |
| 2011/0123821 | A1* | 5/2011 | Hirotsuru ............... C22C 26/00 428/137 |
| 2013/0313711 | A1 | 11/2013 | Kumagai et al. |
| 2018/0012820 | A1 | 1/2018 | Antoniswamy et al. |
| 2018/0255645 | A1* | 9/2018 | Ideno ................. H01L 23/3735 |
| 2019/0157183 | A1 | 5/2019 | Kai et al. |
| 2019/0341330 | A1* | 11/2019 | Ishihara ................. C22C 19/03 |
| 2020/0185315 | A1 | 6/2020 | Matsumoto et al. |

FOREIGN PATENT DOCUMENTS

| | | | |
|---|---|---|---|
| JP | S62-158034 A | 7/1987 | |
| JP | 2008-518384 A | 5/2008 | |
| JP | 2009-130156 A | 6/2009 | |
| JP | 2013-053830 A | 3/2013 | |
| WO | 2010/007922 A1 | 1/2010 | |
| WO | WO-2016067390 A1 * | 5/2016 | ............ H01L 23/36 |
| WO | 2019/097685 A1 | 5/2019 | |

OTHER PUBLICATIONS

Sep. 12, 2023 Extended Search Report issued in European Patent Application No. 21776350.7.

Jan. 15, 2024 Extended European Search Report issued in European Patent Application No. 21776350.7.

Shaukatullah H et al. "Comparative Evaluation of Various Types of Heat Sinks for Thermal Enhancement of Surface Mount Plastic Packages", International Journal of Microcircuits & Packaging, vol. 18, No. 3, Jul. 1, 1995, pp. 252-259.

* cited by examiner

CERAMIC CIRCUIT BOARD, HEAT-DISSIPATING MEMBER, AND ALUMINUM-DIAMOND COMPOSITE

TECHNICAL FIELD

The present invention relates to a ceramic circuit board, a heat-dissipating member, and an aluminum-diamond composite.

BACKGROUND ART

In recent years, ceramic circuit boards and heat-dissipating members have been used as electronic components. The ceramic circuit board is mounted on a heat-dissipating member. Various electronic elements such as Si semiconductor elements are mounted on the ceramic circuit board.

Patent Document 1 describes that a marker pattern is formed on a ceramic circuit board. The marker pattern is formed by, for example, a laser. The marker pattern is arranged in the form of, for example, a bar code or a matrix code. The marker pattern indicates, for example, the model, type characteristics, performance, or size of a ceramic circuit board.

Patent Document 2 describes that an aluminum-diamond composite is used as a heat-dissipating member such as a heat sink. The aluminum-diamond composite includes diamond particles and a metal containing aluminum as a main component. The aluminum-diamond composite includes a composited portion and a surface layer provided on both faces of the composited portion. The surface layer is composed of a metal containing aluminum as a main component.

RELATED DOCUMENT

Patent Document

[Patent Document 1] European Unexamined Patent Publication No. 3361504
[Patent Document 2] Pamphlet of International Publication No. WO 2010/007922

SUMMARY OF THE INVENTION

Technical Problem

In various situations such as a production process for an electronic component, it may be required to acquire information concerning members used for the electronic component (for example, a ceramic circuit board, a heat-dissipating member, or an aluminum-diamond composite).

An example of an object of the present invention is to acquire information concerning a member used for an electronic component by a novel method. Other objects of the present invention will become apparent from the description of the present specification.

Solution to Problem

An aspect of the present invention is a ceramic circuit board including:
a metal layer; and
a marker portion formed on a surface of the metal layer.
Another aspect of the present invention is a heat-dissipating member, the heat-dissipating member including:
a first surface on which a heat-dissipating fin is attached; and
a second surface opposite to the first surface, in which a marker portion is formed on the second surface.

Still another aspect of the invention is an aluminum-diamond composite having a flat plate shape and including diamond particles and a metal containing aluminum as a main component,
in which the aluminum-diamond composite includes a composited portion and surface layers provided on both faces of the composited portion,
the surface layer is composed of a material including a metal containing aluminum as a main component, and
the aluminum-diamond composite includes a marker portion formed on a surface of the surface layer.

Advantageous Effects of Invention

According to an aspect of the present invention, information concerning a member used for an electronic component can be obtained by a novel method.

DESCRIPTION OF EMBODIMENTS

Figure 1:
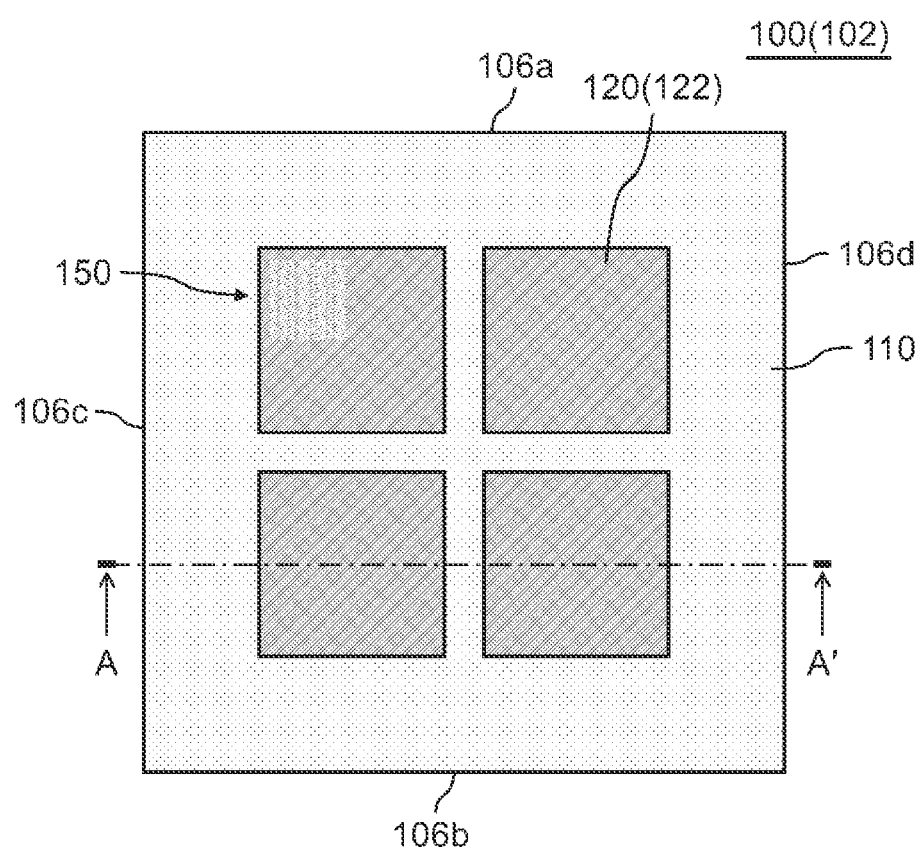
FIG. 1 is a top view of a ceramic circuit board according to Embodiment 1.

Hereinafter, embodiments of the present invention will be described using the drawings. In all the drawings, similar constituent elements will be assigned with similar reference numerals, and further description thereof will not be repeated as appropriate.

Embodiment 1

Figure 2:
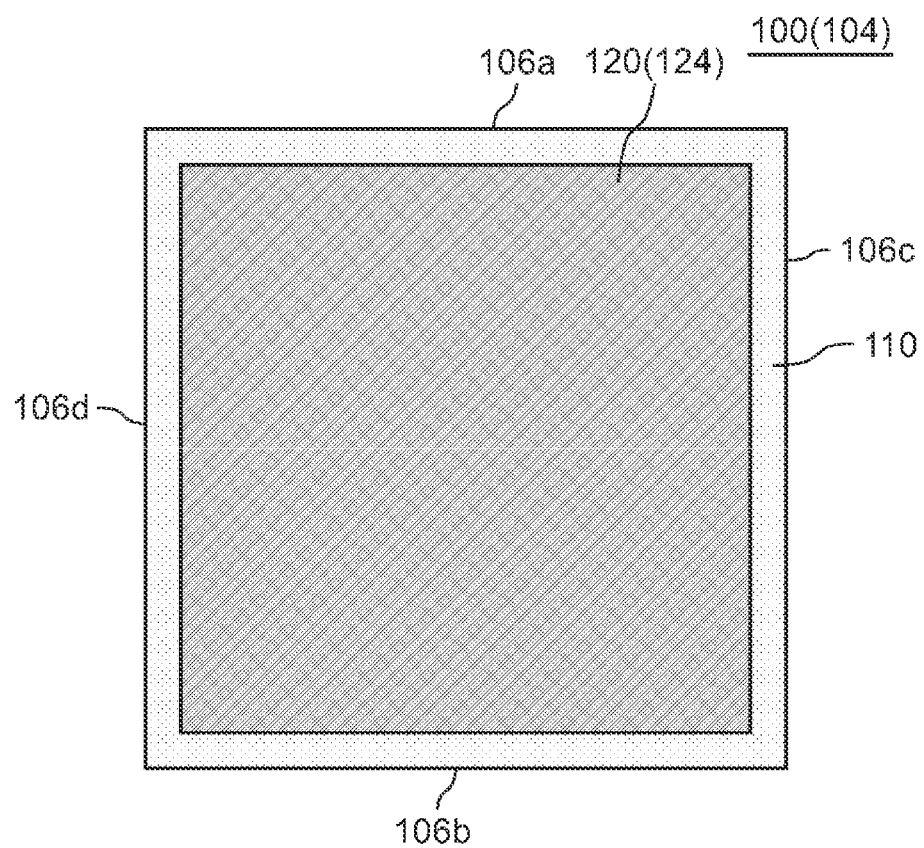
FIG. 2 is a bottom view of the ceramic circuit board shown in FIG. 1.
Figure 3:
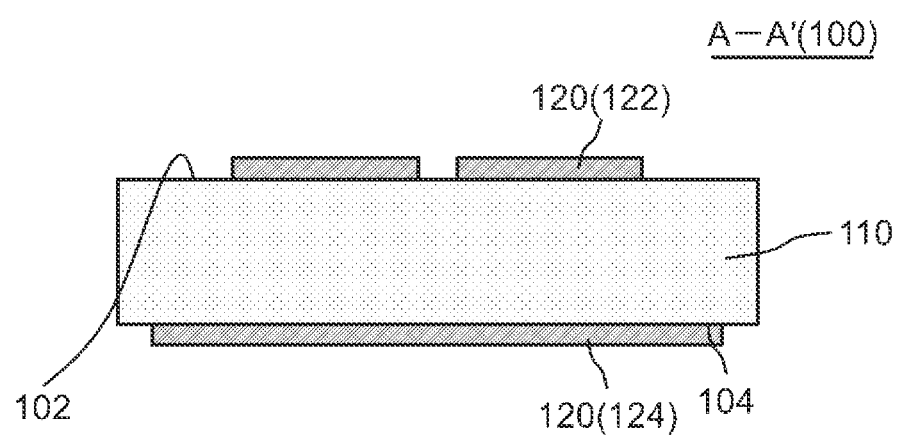
FIG. 3 is a cross-sectional view taken along the line A-A' in FIG. 1.

FIG. 1 is a top view of a ceramic circuit board 100 according to Embodiment 1. FIG. 2 is a bottom view of the ceramic circuit board 100 shown in FIG. 1. FIG. 3 is a cross-sectional view taken along the line A-A' of FIG. 1.

An outline of the ceramic circuit board 100 will be described by using FIG. 1 to FIG. 3. The ceramic circuit board 100 includes a marker portion 150. The marker portion 150 is formed on the surface of the ceramic circuit board 100. Information concerning the ceramic circuit board 100 can be acquired from the marker portion 150.

The details of the ceramic circuit board 100 will be described by using FIG. 1 to FIG. 3.

The ceramic circuit board 100 includes a ceramic base material 110, a metal layer 120 (a first metal layer 122 and a second metal layer 124), and a marker portion 150.

The ceramic circuit board 100 (ceramic base material 110) has a first surface 102, a second surface 104, and side faces (in the example shown in FIG. 1, a first side surface 106a, a second side surface 106b, a third side surface 106c, and a fourth side surface 106d). The second surface 104 is opposite to the first surface 102. Each side face is between the first surface 102 and the second surface 104. The second side surface 106b is opposite to the first side surface 106a. The third side surface 106c is between the first side surface 106a and the second side surface 106b. The fourth side surface 106d is opposite to the third side surface 106c. In the examples shown in FIG. 1 and FIG. 2, the first surface 102 and the second surface 104 of the ceramic base material 110 have a substantially rectangular shape. This rectangle may not be an exact rectangle, and the rectangle may have, for example, sides with sections formed therein or may have rounded corners. The first surface 102 and the second surface 104 of the ceramic base material 110 may have a shape other than a rectangle.

The ceramic base material 110 is formed from, for example, AlN, $Si_3N_4$, or $Al_2O_3$. The thickness of the ceramic base material 110 is, for example, equal to or more than 0.2 mm and equal to or less than 1.5 mm.

The first metal layer 122 is located on the first surface 102 of the ceramic base material 110. The second metal layer 124 is located on the second surface 104 of the ceramic base material 110. The first metal layer 122 forms a metal pattern (for example, a circuit pattern). In the example shown in FIG. 1, this metal pattern includes four rectangular patterns arranged adjacently. However, the metal pattern is not limited to this example. The second metal layer 124, on the other hand, extends over almost the entire second surface 104 of the ceramic base material 110. However, the area of the second metal layer 124 is slightly smaller than the area of the second surface 104. The area of the second metal layer 124 is, for example, equal to or more than 80% and equal to or less than 97% of the area of the second surface 104. The ratio of the area of the first metal layer 122 with respect to the area of the first surface 102 is smaller than the ratio of the area of the second metal layer 124 with respect to the area of the second surface 104.

The metal layer 120 is formed from at least one selected from the group consisting of, for example, Cu, Al, Mo, an alloy including Cu and Mo, and an alloy including Cu and W. The thickness of the metal layer 120 is, for example, equal to or more than 0.1 mm and equal to or less than 2 mm. The surface of the metal layer 120 may be plated. The plating applied to the surface of the metal layer 120 is formed from at least one selected from the group consisting of, for example, Ni, Au, Ag, and Cu.

The marker portion 150 is formed on the surface of the first metal layer 122. However, the marker portion 150 may be formed on the surface of the second metal layer 124 or may be formed on both the surface of the first metal layer 122 and the surface of the second metal layer 124. When the surface of the metal layer 120 (first metal layer 122 or second metal layer 124) is plated, the marker portion 150 may be formed on the surface of the plating or may be covered by the plating.

The marker portion 150 indicates information concerning the ceramic circuit board 100.

In one example, the information concerning the ceramic circuit board 100 is, for example, information including the production conditions for the ceramic circuit board 100. The information including the production conditions for the ceramic circuit board 100 includes, for example, the quality or quantity of the material used for the production of the ceramic circuit board 100, the time or temperature for heating of the ceramic circuit board 100, and the like. In this example, the traceability of the ceramic circuit board 100 can be enhanced by acquiring information including the production conditions for the ceramic circuit board 100 from the marker portion 150.

The shape of the marker portion 150 is not limited to a specific shape. In the example shown in FIG. 1, the marker portion 150 is illustratively a one-dimensional code (bar code). The marker portion 150 may be a two-dimensional code. The marker portion 150 may be both a one-dimensional code and a two-dimensional code. When the marker portion 150 is at least one of a one-dimensional code and a two-dimensional code, the marker portion 150 can include so much information concerning the ceramic circuit board 100. As another example, the marker portion 150 may include, for example, at least one selected from the group consisting of letters, numbers, and symbols.

The marker portion 150 can include various structures formed on the surface of the ceramic base material 110.

In one example, the marker portion 150 is a recess portion formed on the surface of a metal layer 120 (first metal layer 122) of a ceramic base material 110. The recess portion is formed, for example, by a laser on the surface of the metal layer 120 (first metal layer 122) of the ceramic base material 110. The recess portion may be formed by a method other than a laser, such as etching. By using a laser, equipment can be easily added into the line of continuous processes, and thus the marker portion 150 can be easily added without impairing productivity by adding a new process. When the recess portion is a recess portion formed by a laser, since the marker portion (recess portion) can be formed in a region as small as equal to or more than 1 $mm^2$ and equal to or less than 100 $mm^2$, the marker portion (recess portion) can be easily provided even in a narrow region that does not affect the performance of the product. Examples of the narrow region that does not affect the performance of the product may include sites that are not used for assembling, such as soldering and wire bonding. When the marker portion is a marker portion formed by a laser, there is almost no possibility that the marker portion will disappear during the production process, and information can be acquired even after the product is used for a long time period. Particularly, by forming a code such as a two-dimensional code with a laser, a large amount of information can be recorded even in a small marker portion. When a laser is used, for example, a recess portion having a width of equal to or more than 10 μm and equal to or less than 200 μm and a depth of equal to or more than 10 μm and equal to or less than 200 μm can be formed, and thus a code can be formed in a small region. These recess portions formed by lasers are useful also in other embodiments.

In another example, the marker portion 150 may be formed by a coating material. The coating material is, for example, a solder resist and is applied by, for example, inkjetting.

Embodiment 2

Figure 4:
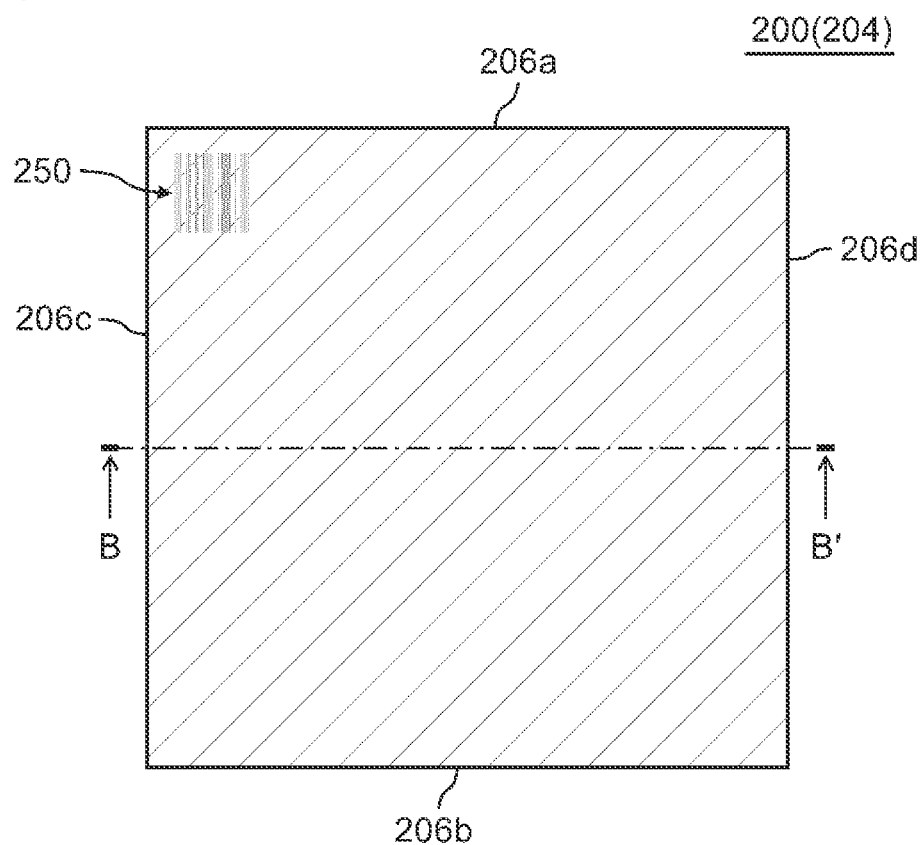
FIG. 4 is a top view of a heat-dissipating member according to Embodiment 2.
Figure 5:
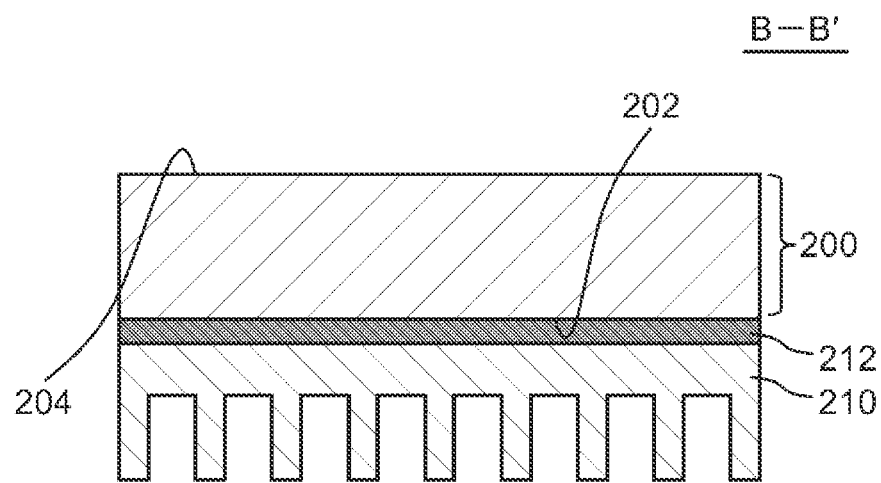
FIG. 5 is a cross-sectional view taken along the line B-B' in FIG. 4.

FIG. 4 is a top view of a heat-dissipating member 200 according to Embodiment 2. FIG. 5 is a cross-sectional view taken along the line B-B' of FIG. 4.

An outline of the heat-dissipating member 200 will be described by using FIG. 4 and FIG. 5. The heat-dissipating member 200 includes a first surface 202 and a second surface 204. The second surface 204 is opposite to the first surface 202. A heat-dissipating fin 210 is attached to the first surface 202 via grease 212. The heat-dissipating fin 210 is attached to the first surface 202 via the grease 212, after an electronic element (not shown in the drawings) such as a Si semiconductor element is mounted on the second surface 204 via a ceramic circuit board (for example, the ceramic circuit board 100 of Embodiment 1) (not shown in the drawings), to form a power module by the heat-dissipating member 200, the ceramic circuit board, and the electronic element. In this case, the heat-dissipating fin 210 may be screwed to the first surface 202 of the heat-dissipating member 200. A marker portion 250 is formed on the second surface 204. Information concerning the heat-dissipating member 200 can be acquired from the marker portion 250. In addition, since the marker portion 250 is formed on the surface opposite to the heat-dissipating fin 210 (second surface 204), the marker portion 250 does not interfere with the heat conduction from the heat-dissipating member 200 to the heat-dissipating fin 210.

The details of the heat-dissipating member 200 will be described by using FIG. 4 and FIG. 5.

The heat-dissipating member 200 has a first surface 202, a second surface 204, and side faces (in the example shown in FIG. 4, a first side surface 206a, a second side surface 206b, a third side surface 206c, and a fourth side surface 206d). Each side face is between the first surface 202 and the second surface 204. The second side surface 206b is opposite to the first side surface 206a. The third side surface 206c is between the first side surface 206a and the second side surface 206b. The fourth side surface 206d is opposite to the third side surface 206c. In the example shown in FIG. 4, the second surface 204 of the heat-dissipating member 200 has a substantially rectangular shape. This rectangle may not be an exact rectangle, and the rectangle may have, for example, sides with sections formed therein or may have rounded corners. The second surface 204 of the heat-dissipating member 200 may have a shape other than a rectangle.

The heat-dissipating member 200 is composed of, for example, a metal base composite composed of a metal containing Al or Mg as a main component (for example, equal to or more than 85% by mass) and at least one selected from the group consisting of SiC, $Si_3N_4$, $Al_2O_3$, $SiO_2$, and AlN; an alloy including Cu and Mo or an alloy including Cu and W (for example, Cu/Mo or Cu/W alloy); or a multilayer metal plate formed from Cu and Mo or Cu and W (Cu/Mo or Cu/W multilayer metal plate). The coefficient of linear expansion of the heat-dissipating member 200 is, for example, equal to or more than $5\times10^{-6}$/K and equal to or less than $9\times10^{-6}$/K. The thermal conductivity of the heat-dissipating member 200 is, for example, equal to or more than 150 W/mK.

It is preferable that the surface of the heat-dissipating member 200 (for example, a first surface 202, a second surface 204, a first side surface 206a, a second side surface 206b, a third side surface 206c, and a fourth side surface 206d) is plated. The plating applied to the surface of the heat-dissipating member 200 is formed from at least one selected from the group consisting of, for example, Ni, Au, Ag, and Cu. When the surface of the heat-dissipating member 200 is plated, the marker portion 250 may be formed on the surface of the plating or may be covered with the plating.

The marker portion 250 indicates information concerning the heat-dissipating member 200.

In one example, the information concerning the heat-dissipating member 200 is, for example, information including the direction of warpage of the heat-dissipating member 200. For example, when the heat-dissipating member 200 is warped convexly from the second surface 204 toward the first surface 202, it is preferable that the marker portion 250 is located on the second surface 204 side. If the heat-dissipating member 200 is warped convexly from the first surface 202 toward the second surface 204, and the heat-dissipating fin 210 is attached to the first surface 202, the heat-dissipating fin 210 is not in with the heat-dissipating member 200 well, and satisfactory heat dissipation by the heat-dissipating fin 210 is not realized. When, on the other hand, the heat-dissipating member 200 is warped convexly from the second surface 204 toward the first surface 202, and the heat-dissipating fin 210 is attached to the first surface 202, the heat-dissipating fin 210 is in contact with the heat-dissipating member 200 well, and satisfactory heat dissipation by the heat-dissipating fin 210 is realized. When the heat-dissipating member 200 is warped convexly from the second surface 204 toward the first surface 202, and the marker portion 250 is located on the second surface 204 side, the manufacturer of the electronic component can determine that it is preferable to attach the heat-dissipating fin 210 to the surface opposite to the marker portion 250 (that is, the first surface 202).

In another example, the information concerning the heat-dissipating member 200 is, for example, information including the production conditions for the heat-dissipating member 200. The information including the production conditions for the heat-dissipating member 200 includes, for example, the quality or quantity of the material used for the production of the heat-dissipating member 200, the time or temperature for heating of the heat-dissipating member 200, and the like. In this example, the traceability of the heat-dissipating member 200 can be enhanced by acquiring the information including the production conditions for the heat-dissipating member 200 from the marker portion 250.

The shape of the marker portion 250 is not limited to a specific shape. In the example shown in FIG. 4, the marker portion 250 is illustratively a one-dimensional code (bar code). The marker portion 250 may be a two-dimensional code. The marker portion 250 may be both a one-dimensional code and a two-dimensional code. When the marker portion 250 is at least one of a one-dimensional code and a two-dimensional code, the marker portion 250 can include so much information concerning the heat-dissipating member 200. As another example, the marker portion 250 may include, for example, at least one selected from the group consisting of letters, numbers, and symbols.

The marker portion 250 can include various structures formed on the surface of the heat-dissipating member 200.

In one example, the marker portion 250 is a recess portion formed on the surface (second surface 204) of the heat-dissipating member 200. The recess portion is formed by, for example, a laser on the surface (second surface 204) of the heat-dissipating member 200. The recess portion may be formed by a method other than a laser, such as etching.

In another example, the marker portion 250 may be formed by a coating material. The coating material may be, for example, the same as the coating material used for the marker portion 150 of Embodiment 1.

Embodiment 3

Figure 6:
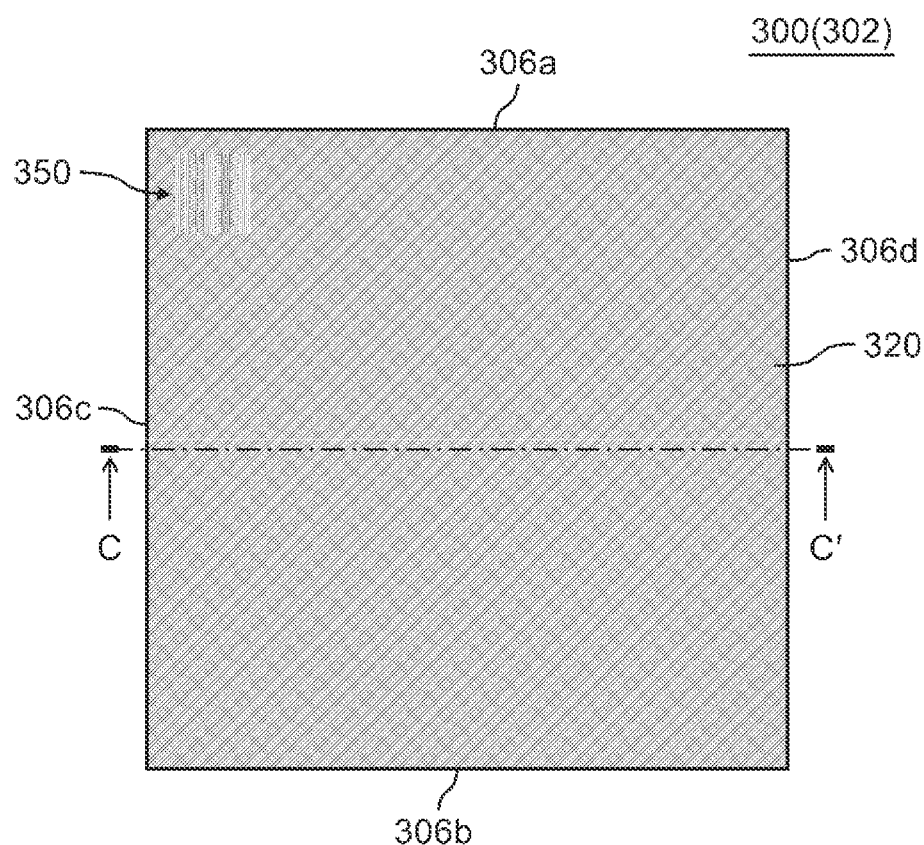
FIG. 6 is a top view of an aluminum-diamond composite according to Embodiment 3.
Figure 7:
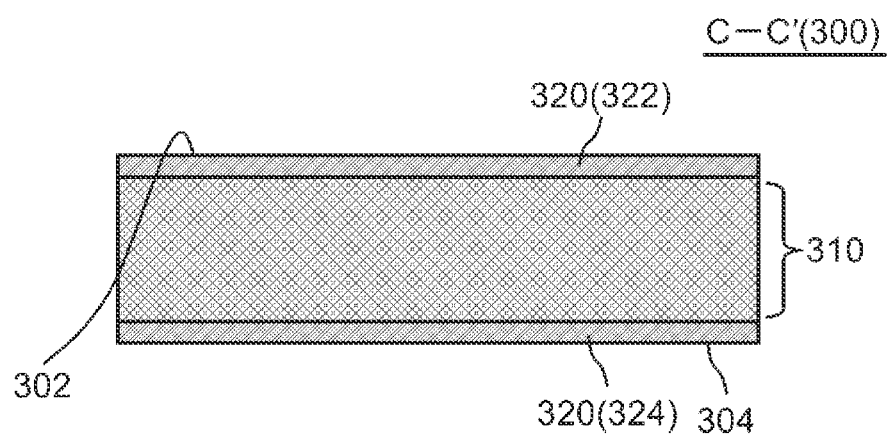
FIG. 7 is a cross-sectional view taken along the line C-C' in FIG. 6.

FIG. 6 is a top view of an aluminum-diamond composite 300 according to Embodiment 3. FIG. 7 is a cross-sectional view taken along the line C-C' of FIG. 6.

An outline of the aluminum-diamond composite 300 will be described by using FIG. 6 and FIG. 7. The aluminum-diamond composite 300 is a flat plate including diamond particles and a metal containing aluminum as a main component. The aluminum-diamond composite 300 is composed of a composited portion 310 and surface layers 320 (first surface layer 322 and second surface layer 324) provided on both faces of the composited portion 310. The surface layer 320 is composed of a material including a metal containing aluminum as a main component. The aluminum-diamond composite 300 includes a marker portion 350. The marker portion 350 is formed on the surface of the surface layer 320. Information concerning the aluminum-diamond composite 300 can be acquired from the marker portion 350.

The details of the aluminum-diamond composite 300 will be described by using FIG. 6 and FIG. 7.

The aluminum-diamond composite 300 has a first surface 302, a second surface 304, and side faces (in the example shown in FIG. 6, a first side surface 306a, a second side surface 306b, a third side surface 306c, and a fourth side surface 306d). The second surface 304 is opposite to the first surface 302. Each side face is between the first surface 302 and the second surface 304. The second side surface 306b is opposite to the first side surface 306a. The third side surface 306c is between the first side surface 306a and the second side surface 306b. The fourth side surface 306d is opposite to the third side surface 306c. In the example shown in FIG. 6, the first surface 302 of the aluminum-diamond composite 300 has a substantially rectangular shape. This rectangle may not be an exact rectangle, and the rectangle may have, for example, sides with sections formed therein or may have rounded corners. The first surface 302 of the aluminum-diamond composite 300 may have a shape other than a rectangle.

The thickness of the aluminum-diamond composite 300 is, for example, equal to or more than 0.4 mm and equal to or less than 6 mm.

The composited portion 310 is a composited portion of diamond particles and an aluminum alloy. The content of the diamond particles is, for example, equal to or more than 40% by volume and equal to or less than 75% by volume with respect to the total volume of the aluminum-diamond composite 300. The aluminum alloy is a metal containing aluminum as a main component. The aluminum alloy includes, for example, equal to or more than 75% by mass of aluminum with respect to the total mass of the aluminum alloy. The aluminum alloy may include equal to or more than 5% by mass and equal to or less than 25% by mass of silicon with respect to the total mass of the aluminum alloy. The aluminum alloy may further include magnesium.

The surface layer 320 is composed of a material including a metal containing aluminum as a main component. The surface layer 320 includes, for example, equal to or more than 80% by volume of the metal with respect to the total volume of the surface layer 320. The surface roughness Ra of the surface layer 320 is, for example, equal to or less than 1 μm. On the surface of the surface layer 320, a Ni plating layer or two layers of Ni plating and Au plating may be formed with a thickness of, for example, equal to or more than 0.5 μm and equal to or less than 10 μm.

The marker portion 350 indicates information concerning the aluminum-diamond composite 300.

In one example, the information concerning the aluminum-diamond composite 300 is, for example, information including the production conditions for the aluminum-diamond composite 300. The information including the production conditions for the aluminum-diamond composite 300 includes, for example, the quality or quantity of the material used in the production of the aluminum-diamond composite 300, the time or temperature for heating of the aluminum-diamond composite 300, and the like. In this example, the traceability of the aluminum-diamond composite 300 can be enhanced by acquiring the information including the production conditions for the aluminum-diamond composite 300 from the marker portion 350.

The shape of the marker portion 350 is not limited to a specific shape. In the example shown in FIG. 6, the marker portion 350 is illustratively a one-dimensional code (bar code). The marker portion 350 may be a two-dimensional code. The marker portion 350 may be both a one-dimensional code and a two-dimensional code. When the marker portion 350 is at least one of a one-dimensional code and a two-dimensional code, the marker portion 350 can include so much information concerning the aluminum-diamond composite 300. As another example, the marker portion 350 may include, for example, at least one selected from the group consisting of letters, numbers, and symbols.

The marker portion 350 can include various structures formed on the surface of the aluminum-diamond composite 300.

In one example, the marker portion 350 is a recess portion formed on the surface of the aluminum-diamond composite 300. The recess portion is formed on, for example, the aluminum-diamond composite 300 by a laser. The recess portion may be formed by a method other than a laser, such as etching.

In another example, the marker portion 350 may be formed by a coating material. The coating material may be, for example, the same as the coating material used for the marker portion 150 of Embodiment 1.

Although embodiments of the present invention have been described with reference to the drawings, these are merely examples of the present invention, and various configurations other than the above-described ones may be adopted.

This patent application claims priority based on Japanese Patent Application No. 2020-055457, filed on Mar. 26, 2020, the disclosure of which is incorporated herein in its entirety by reference.

REFERENCE SIGNS LIST

100: ceramic circuit board
102: first surface
104: second surface
106a: first side surface
106b: second side surface
106c: third side surface
106d: fourth side surface
110: ceramic base material
120: metal layer
122: first metal layer
124: second metal layer
150: marker portion
200: marker
200: heat-dissipating member
202: recess portion
202: first surface
204: second surface
206a: first side surface
206b: second side surface
206c: third side surface
206d: fourth side surface
210: heat-dissipating fin
212: grease
250: marker portion
302: first surface
304: second surface
306a: first side surface
306b: second side surface 306c: third side surface
306d: fourth side surface
310: composited portion
320: surface layer
322: first surface layer
324: second surface layer
350: marker portion

The invention claimed is:

1. A ceramic circuit board comprising:
a metal layer; and
a marker portion formed on a surface of the metal layer,
wherein the marker portion is a laser-formed recess portion on the surface of the metal layer,
wherein the recess portion has a width of equal to or more than 10 µm and equal to or less than 200 µm and a depth of equal to or more than 10 µm and equal to or less than 200 µm, and
wherein the marker portion is at least one of a one-dimensional code and a two-dimensional code.

2. The ceramic circuit board according to claim 1,
wherein the marker portion indicates information including production conditions for the ceramic circuit board.

3. The ceramic circuit board according to claim 1,
wherein a surface of the metal layer is plated.

4. A heat-dissipating member, comprising:
a first surface on which a heat-dissipating fin is attached; and
a second surface opposite to the first surface, wherein a marker portion is formed on the second surface,
wherein the marker portion is a laser-formed recess portion on the second surface of the heat-dissipating member,
wherein the recess portion has a width of equal to or more than 10 µm and equal to or less than 200 µm and a depth of equal to or more than 10 µm and equal to or less than 200 µm, and
wherein the marker portion is at least one of a one-dimensional code and a two-dimensional code.

5. The heat-dissipating member according to claim 4,
wherein the marker portion indicates information including a direction of warpage of the heat-dissipating member.

6. The heat-dissipating member according to claim 4,
wherein the marker portion indicates information including production conditions for the heat-dissipating member.

7. An aluminum-diamond composite having a flat plate shape, comprising diamond particles and a metal containing aluminum as a main component,
wherein the aluminum-diamond composite includes a composited portion and surface layers provided on both faces of the composited portion,
the surface layer is composed of a material including a metal containing aluminum as a main component,
the aluminum-diamond composite includes a marker portion formed on a surface of the surface layer,
wherein the marker portion is a laser-formed recess portion on the surface,
wherein the recess portion has a width of equal to or more than 10 µm and equal to or less than 200 µm and a depth of equal to or more than 10 µm and equal to or less than 200 µm, and
wherein the marker portion is at least one of a one-dimensional code and a two-dimensional code.

8. The aluminum-diamond composite according to claim 7,
wherein the marker portion indicates information including production conditions for the aluminum-diamond composite.

* * * * *